United States Patent
Ullmann

(10) Patent No.: US 7,719,348 B2
(45) Date of Patent: May 18, 2010

(54) CAPACTIVE FILTER DEVICE INCORPORATING A SWITCHING ARRANGEMENT

(76) Inventor: Igor Ullmann, Heidenfeldstr. 19, 9500 Villach (AT)

( * ) Notice: Subject to any disclaimer, the term of this patent is extended or adjusted under 35 U.S.C. 154(b) by 0 days.

(21) Appl. No.: 11/828,918

(22) Filed: Jul. 26, 2007

(65) Prior Publication Data
US 2008/0084242 A1    Apr. 10, 2008

(30) Foreign Application Priority Data
Jul. 26, 2006   (DE)   .......................... 10 2006 034 581

(51) Int. Cl.
*H03B 1/00*   (2006.01)
*H03K 5/00*   (2006.01)
*H04B 1/10*   (2006.01)

(52) U.S. Cl. .................. 327/552; 327/337; 327/554

(58) Field of Classification Search .................. 327/552, 327/554, 337
See application file for complete search history.

(56) References Cited

U.S. PATENT DOCUMENTS

| | | | | |
|---|---|---|---|---|
| 4,733,205 A | * | 3/1988 | Hughes | 333/172 |
| 5,309,112 A | * | 5/1994 | Lee et al. | 327/552 |
| 5,736,895 A | * | 4/1998 | Yu et al. | 327/554 |
| 6,194,946 B1 | * | 2/2001 | Fowers | 327/337 |
| 2003/0132799 A1 | * | 7/2003 | Low et al. | 327/554 |
| 2003/0197553 A1 | * | 10/2003 | Itakura et al. | 327/554 |
| 2005/0218998 A1 | | 10/2005 | Lim | |

FOREIGN PATENT DOCUMENTS

EP    0413472    2/1991

OTHER PUBLICATIONS

Maneatis, "Low-Jitter Process-Independent DLL and PLL Based on Self-Biased Techniques", IEEE Journal of Solid-State Circuits, vol. 31, No. 11, Nov. 1996, pp. 1723-1732.
Nash, "Phase-Locked Loop Design Fundamentals", AN535 Application Note, Motorola, Inc., 1994.
Tietze, "Halbleiter-Schaltungstechnik", 1990 Springer Verlag Berlin, Edition 9, ISBN 3-540-19475-4, pp. 450-457.

* cited by examiner

*Primary Examiner*—Lincoln Donovan
*Assistant Examiner*—John W Poos
(74) *Attorney, Agent, or Firm*—Lee & Hayes, PLLC

(57) ABSTRACT

A filter device is disclosed that includes a switched capacitor circuit.

9 Claims, 1 Drawing Sheet

CAPACTIVE FILTER DEVICE INCORPORATING A SWITCHING ARRANGEMENT

CROSS-REFERENCE TO RELATED APPLICATION

This application claims priority under 35 USC Section 119 to German Patent Application No. 10 2006 034 581.9, filed on Jul. 26, 2006 and titled "Filter Device," the entire contents of which are hereby incorporated by reference.

TECHNICAL FIELD

The present disclosure is related to filter devices and, in particular, to analog filter devices.

BACKGROUND

Current analog filter designs, for example, analog PLL (phase lock loop) designs, are mostly based on continuous time loop filters comprising resistor and/or capacitor (R-C) elements. For example, a third order PLL, which is widely chosen as forming an optimal compromise between jitter performance and stability, i.e. peaking and ringing, loop filter structure, such as generally depicted in FIG. 2, may be employed.

Since the PLLs are used for fully or partly integrated applications such as high speed clock and data recovery (CDR), frequency synthesizers, clock generators etc., if it is advantageous to obtain a highly process and temperature independent loop filter structure for phase-locked loop architectures or other architectures that allow almost constant loop characteristics which may be a loop bandwidth, stability, jitter performance etc.

SUMMARY

According to one aspect, a filter device is disclosed comprising an operational amplifier and a switched capacitor circuit coupled between an input and an output of the operational amplifier.

The switched capacitor circuit may comprise a capacitor and a switch arrangement that is, for example, switchable with a switch frequency. The capacitor may have a capacitance value that depends on the switch frequency. Since the switch frequency at least partly determines the capacitance value of the capacitor, a relationship between the switch frequency and the capacitance value exists.

According to another aspect, the filter device may comprise a controller controlling the switch arrangement such that a switchability of the switch arrangement with the switch frequency is obtained. The switch arrangement may comprise one or more switches being formed by transistors being settable into a conductive or into a non-conductive state according to a control signal provided by, for example, the controller with the switch frequency.

According to yet another aspect, the switched capacitor circuit may comprise a further capacitor, wherein the capacitance value may be determined based on the following formula:

$$Cr = Cb/(1.1 * (Cb * Rcr * fclk - 1)) \quad (1)$$

wherein Cr is the capacitance value of the capacitor, Cb is a capacitance value of the further capacitor, Rcr is the desired impedance value which is to be emulated by the switched capacitor circuit and wherein fclk denotes the switch frequency. The switched frequency is preferably $$fclk > 1.5/(Cb * Rcr). \quad (2)$$

According to a further aspect, the switch arrangement is configured for switchably connecting the further capacitor in parallel to the capacitor.

A filter device may be provided comprising a switched capacitor circuit arranged to emulate a resistor, the switched capacitor circuit comprising a capacitor and a switch arrangement, wherein a capacitance value of the capacitor depends on the switch frequency. For example, the dependency between the capacitance value and the switch frequency and the value for the switch frequency are chosen using the aforementioned formulas.

Furthermore, the circuit device may comprise a capacitor, wherein the switch arrangement may switchably connect the further capacitor in parallel to the capacitor.

One implementation further provides a device for filtering comprising an amplifying mechanism and a switched capacitor mechanism, the switched capacitor mechanism being coupled between an input and an output of the amplifying mechanism. The switched capacitor mechanism may comprise a capacitor and a switch arrangement, the switch arrangement being switchable with a switch frequency, a capacitance value of the capacitor depending on the switch frequency.

The switched capacitor mechanism may comprise a further capacitor, wherein the capacitance value may depend from the switch frequency and/or from a further value of the further capacitance according to the aforementioned formula. Furthermore, the switch frequency may be chosen according to the aforementioned switch frequency formula.

Another implementation provides a filtering mechanism including a switched capacitor mechanism for forming or emulating a resistor function. The switched capacitor mechanism further comprises a capacitor and a switch arrangement that is switchable with a switch frequency, wherein a capacitance value of the capacitor depends on the switch frequency.

According to another aspect, the switched capacitor mechanism may include a further capacitor wherein the capacitance value may depend on a further capacitance value of the further capacitor and/or on the switch frequency according to the aforementioned capacitance formula. Furthermore, the switch frequency may be chosen according to the aforementioned switched frequency formula.

An exemplary method for filtering is also disclosed that includes amplifying a signal using an operational amplifier to obtain an amplified signal, and feeding back the amplified signal through a switched capacitor circuit to an input of the operational amplifier.

The method may further include adjusting a capacitance value of a capacitor that includes the switched capacitor circuit, the capacitance depending on a switch frequency of the switch arrangement of the switched capacitor circuit.

The switched capacitor circuit may have a further capacitor and the method may include choosing the capacitance value according to the aforementioned formula. The method may further comprise choosing the switched frequency according to the aforementioned switched frequency formula.

Also disclosed herein is a method for filtering comprising using a switched capacitor circuit to form or to emulate a resistor, the switched capacitor circuit comprising a capacitor and a switch arrangement. The method may further comprise switching the switch arrangement with a switch frequency, wherein the capacitance value of the capacitor depends on the switch frequency.

The capacitance value and the switch frequency may be chosen according to the aforementioned formula.

BRIEF DESCRIPTION OF THE DRAWINGS

Further embodiments will be described with reference to the following figures.

DETAILED DESCRIPTION

Figure 1:
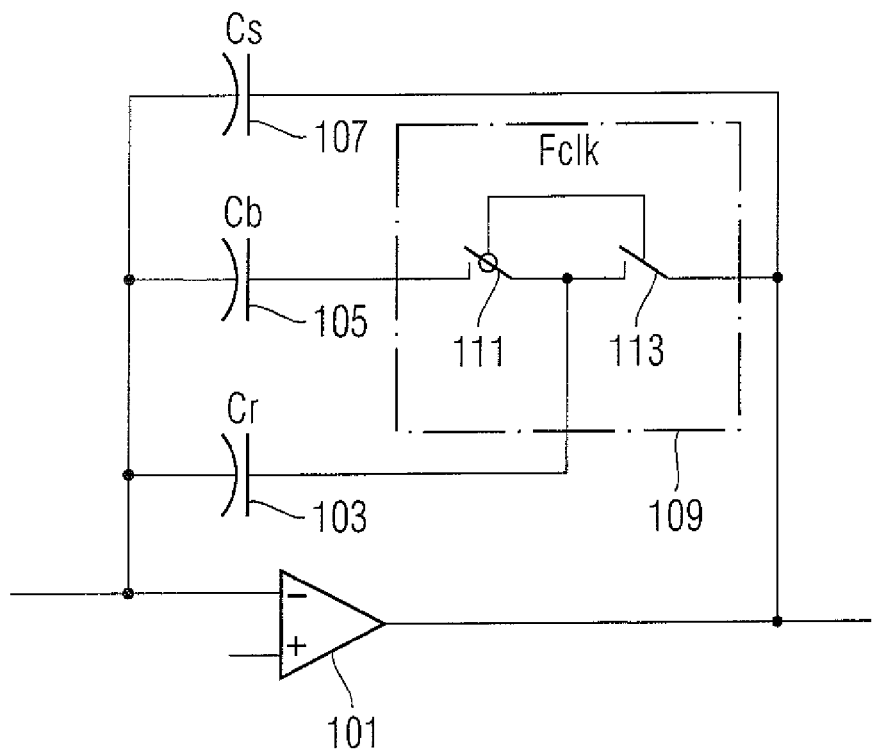
FIG. 1 shows a diagram of the filter device.

FIG. 1 shows a filter device comprising an operational amplifier 101, a capacitor 103 (Cr), a further capacitor 105 (Cb), and an optional capacitor 107 (Cs). The filter device further comprises a switch arrangement 109 comprising a first switch 111 and a second switch 113.

The switch arrangement 109, the capacitor 103 and the further capacitor 105 form a switched capacitor circuit being coupled between an output and an input of the operational amplifier 101. The first and the second switch 111, 113 of the switch arrangement 109 are, for example, simultaneously switchable with a frequency Fclk. In particular, in a closed position, the capacitors 103 and 105 are connected in parallel, wherein a terminal of the capacitor 103 is coupled to a node between the first switch 111 and the second switch 113. A terminal of the further capacitor 105 is connected to another terminal of the switch 111 which is, in a switched position, connected to the node between the switches 111 and 113. The optional capacitor 107 is coupled between the output and the input of the operational amplifier.

For example, the capacitor 103 has a value Cr=6 pF, the further capacitor 105 has a capacitance value Cb=20 pF and the capacitor 107 has a capacitance value Cs=0.25 pF. The above values are set, for example, for the frequency fin=fclk=250 MHz, fout=1 GHz and fn=10 MHz.

The switched capacitor circuit is arranged to emulate a resistive element the resistance value of which may be calculated from the following formula:

$$Rcr=(1.1*Cr+Cb)/(1.1*Cr*Cb*fclk). \quad (3)$$

For example, with the above indicated values, Rcr=800Ω. In this case, Ron is approximately 100Ω.

Figure 2:
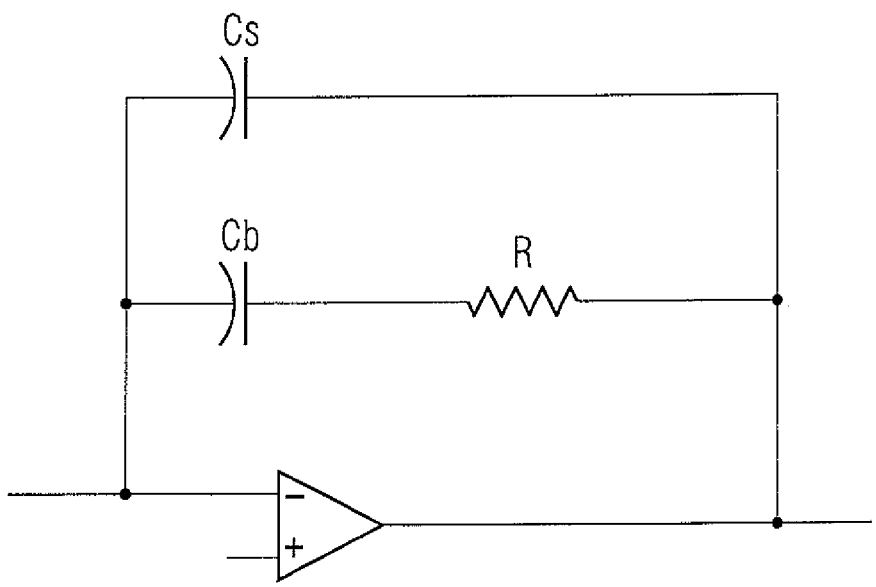
FIG. 2 shows a characteristic of the filter device.

FIG. 2 shows a second order loop (e.g. a single ended version) filter comprising two capacitors Cs and Cb and a resistor R connected in series with the capacitor Cb. Furthermore, an operational amplifier is provided. For example, the filter structure shown in FIG. 2 may be implemented as an active device (e.g. MOSFET) especially for self-biased PLL structures]. The passive, highly process-dependent resistor device R, shown in FIG. 2, is replaced by a switched capacitor path. This concept may reduce process dependency of loop filter impedance so that one or more stable loop characteristics may be achieved. Noise/jitter performance of the PLL may be enhanced due to the absence of a resistor. A tunability of the loop filter may be enhanced by the switched capacitor clock for an optional bandwidth tracking.

A switched capacitor circuit may be used for a resistor replacement in an active second order loop filter as shown in FIG. 2. The active loop filter is preferably a fully differential filter which reduces the influence of switching noise on the jitter performance of the PLL. The switched capacitor clock source generating the switch frequency fclk (FCLK) can either be a PLL input clock, a PLL output clock or any non-PLL or non-PLL-related clock. The clock may be overlapping or non-overlapping. The clock is preferably symmetrical.

The switched capacitor loop filter structure offers a highly process and temperature independent operation and can be used for tuning or tracking purposes and guarantees a stable and low-noise operation.

According to an aspect, a voltage across the capacitor 105 (Cb), shown in FIG. 1, may be calculated recursively on the basis of the following formula for Ub:

$$Ub^1=(Cr*Ur^0+Cb*Ub^0)/(Cr+Cb)$$

$$Ub^0=0V, Ur^0=Ui$$

$$Ub^1=Cr*Ui/(Cr+Cb) \quad (4)$$

The slope at t=0 for a RC-filter jump reaction determines the rising of the slope from 0 to Ui according to:

$$Src=Ui/(R*C) \quad (5)$$

The slope at t=0 for SC-filter jump reaction resulting in a rising slope from 0 to Ui is:

$$Ssc=Ub^1*fclk \quad (6)$$

Setting Sb=Src yields:

$$1/(Rcr*Cb)=Cr*fclk/(Cr+Cb) \rightarrow Rcr=(1.1*Cr+Cb)/(1.1*Cr*Cb*fclk) \quad (7)$$

The correction factor 1.1 is introduced in order to adjust the capacitance value such that the desired resistance value Rcr is obtained.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The invention claimed is:

1. A filter device comprising:
an operational amplifier, and
a switched capacitor circuit coupled between an input and an output of the operational amplifier, the switched capacitor circuit comprising a first capacitor, a second capacitor, a third capacitor, and a switch arrangement, the switch arrangement being switchable during operation of the filter device with a constant switch frequency fclk so that the switched capacitor circuit is arranged to emulate a resistor during operation of the filter device,
wherein the second capacitor has a capacitance value Cr which is determinable according to the formula:

$$Cr=Cb/(1.1*(Cb*Rcr*fclk-1))$$

wherein Rcr is a resistance value to be emulated by the switched capacitor circuit, fclk is the switch frequency and Cb is a capacitance value of the first capacitor comprised by the switch capacitor circuit.

2. A filter device according to claim 1, wherein the switch frequency fclk is determinable according to $$fclk-1.5/(Cb*Rcr)$$

wherein Rcr is a resistance value to be emulated by the switched capacitor circuit and Cb is a capacitance value of the first capacitor comprised by the switched capacitor circuit.

3. A method for filtering, comprising:
amplifying a signal to obtain an amplified signal using an operational amplifier; and
feeding back the amplified signal via a switched capacitor circuit to an input of the operational amplifier,
the switched capacitor circuit comprising:
a first capacitor, a second capacitor, a third capacitor, and a switch arrangement, the switch arrangement being switchable during operation of the filter device with a constant switch frequency fclk so that the switched capacitor circuit is arranged to emulate a resistor during operation of the filter device,
wherein the second capacitor has a capacitance value $$Cr=Cb/(1.1*(Cb*Rcr*fclk-1))$$

wherein Rcr is a resistance value to be emulated by the switched capacitor circuit, fclk is the switch frequency and Cb is a capacitance value of the first capacitor comprised by the switched capacitor circuit.

4. A method for filtering according to claim 3, the switch frequency fclk being determinable according to the following formula $$fclk<1.5/(Cb*Rcr)$$

wherein Rcr is a resistance value to be emulated by the switched capacitor circuit and Cb is a capacitance value of the first capacitor comprised by the switched capacitor circuit.

5. A filter device comprising:
an operational amplifier, and
a switched capacitor circuit coupled between an input and an output of the operational amplifier, the switched capacitor circuit comprising a first capacitor, a second capacitor, a third capacitor, and a switch arrangement, the switch arrangement being switchable during operation of the filter device with a constant switch frequency fclk so that the switched capacitor circuit is arranged to emulate a resistor during operation of the filter device,
wherein the switch arrangement is configured to couple the first capacitor in parallel with the second capacitor, and
wherein the switch arrangement is configured to couple the third capacitor in parallel with the first capacitor.

6. A filter device comprising:
an operational amplifier, and
a switched capacitor circuit coupled between an input and an output of the operational amplifier, the switched capacitor circuit comprising a first capacitor, a second capacitor, a third capacitor, and a switch arrangement, the switch arrangement being switchable during operation of the filter device with a constant switch frequency fclk so that the switched capacitor circuit is arranged to emulate a resistor during operation of the filter device,
wherein the switch arrangement is configured to couple the first capacitor in parallel with the second capacitor, and
wherein the switch arrangement is configured to couple the third capacitor in parallel with the second capacitor.

7. A method for filtering, comprising:
amplifying a signal to obtain an amplified signal using an operational amplifier;
feeding back the amplified signal via a switched capacitor circuit to an input of the operational amplifier,
the switched capacitor circuit comprising:
a first capacitor, a second capacitor, a third capacitor, and a switch arrangement, the switch arrangement being switchable during operation of the filter device with a constant switch frequency fclk so that the switched capacitor circuit is arranged to emulate a resistor during operation of the filter device;
coupling the first capacitor in parallel with the second capacitor using the switch arrangement; and
coupling the third capacitor in parallel with the first capacitor using the switch arrangement.

8. A method for filtering, comprising:
amplifying a signal to obtain an amplified signal using an operational amplifier;
feeding back the amplified signal via a switched capacitor circuit to an input of the operational amplifier,
the switched capacitor circuit comprising:
a first capacitor, a second capacitor, a third capacitor, and a switch arrangement, the switch arrangement being switchable during operation of the filter device with a constant switch frequency fclk so that the switched capacitor circuit is arranged to emulate a resistor during operation of the filter device;
coupling the first capacitor in parallel with the second capacitor using the switch arrangement; and
coupling the third capacitor in parallel with the second capacitor using the switch arrangement.

9. A filter device comprising:
an operational amplifier, and
a switched capacitor circuit coupled between an input and an output of the operational amplifier, the switched capacitor circuit comprising a first capacitor, a second capacitor, a third capacitor, and a switch arrangement, the switch arrangement being switchable with a switch frequency the switch arrangement comprising a first switch and a second switch, wherein the first capacitor, the first switch, and the second switch are coupled in series between the input and the output of the operational amplifier, and
the second capacitor is coupled between the input of the operational amplifier and a node between the first switch and the second switch.

* * * * *

UNITED STATES PATENT AND TRADEMARK OFFICE
CERTIFICATE OF CORRECTION

PATENT NO. : 7,719,348 B2  Page 1 of 1
APPLICATION NO. : 11/828918
DATED : May 18, 2010
INVENTOR(S) : Igor Ullmann It is certified that error appears in the above-identified patent and that said Letters Patent is hereby corrected as shown below:

Col. 4 line 67
Claim 2, change "$fclk-1.5/(Cb*Rcr)$" to -- $fclk > 1.5/(Cb*Rcr)$ --.

Claim 4, change "$fclk < 1.5/(Cb*Rcr)$" to -- $fclk > 1.5/(Cb*Rcr)$ --.

Signed and Sealed this

Thirty-first Day of August, 2010

David J. Kappos
*Director of the United States Patent and Trademark Office*

UNITED STATES PATENT AND TRADEMARK OFFICE
CERTIFICATE OF CORRECTION

PATENT NO.       : 7,719,348 B2                                        Page 1 of 1
APPLICATION NO.  : 11/828918
DATED            : May 18, 2010
INVENTOR(S)      : Igor Ullmann It is certified that error appears in the above-identified patent and that said Letters Patent is hereby corrected as shown below:

Col. 4 line 67
Claim 2, change "*fclk-1.5/(Cb\*Rcr)*" to -- fclk> 1.5/(Cb\*Rcr) --.

Col. 5 line 27
Claim 4, change "*fclk<1.5/(Cb\*Rcr)*" to -- fclk> 1.5/(Cb\*Rcr) --.

This certificate supersedes the Certificate of Correction issued August 31, 2010.

Signed and Sealed this

Twenty-eighth Day of September, 2010

David J. Kappos
*Director of the United States Patent and Trademark Office*